United States Patent
Chang et al.

(10) Patent No.: US 9,398,707 B2
(45) Date of Patent: Jul. 19, 2016

(54) EXPANSION PLATFORM FOR PORTABLE ELECTRONIC APPARATUS

(71) Applicant: Wistron Corporation, New Taipei (TW)

(72) Inventors: Fang-Ta Chang, New Taipei (TW); Lee Hua Yu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 495 days.

(21) Appl. No.: 13/939,744

(22) Filed: Jul. 11, 2013

(65) Prior Publication Data

US 2014/0037372 A1 Feb. 6, 2014

(30) Foreign Application Priority Data

Aug. 3, 2012 (TW) .............................. 101128073 A

(51) Int. Cl.
*H05K 5/02* (2006.01)
*G06F 1/16* (2006.01)

(52) U.S. Cl.
CPC ............ *H05K 5/0221* (2013.01); *G06F 1/1632* (2013.01); *G06F 1/1681* (2013.01); *Y10T 403/602* (2015.01)

(58) Field of Classification Search
CPC ....... G06F 1/16; G06F 1/1632; G06F 1/1654; G06F 1/1656; G06F 1/1669; G06F 1/1679; G06F 1/1681; H05K 5/0221
See application file for complete search history.

(56) References Cited

U.S. PATENT DOCUMENTS

| | | | | |
|---|---|---|---|---|
| 7,123,476 B2 * | 10/2006 | Ke | ......................... | G06F 1/1632 248/346.01 |
| 7,411,781 B2 * | 8/2008 | Yang | ......................... | E05C 1/10 292/56 |
| 7,480,132 B2 * | 1/2009 | Wu | ........................ | G06F 1/1616 292/128 |
| 7,495,898 B2 * | 2/2009 | Lo | .......................... | G06F 1/1616 361/679.55 |
| 7,599,178 B2 * | 10/2009 | Huang | .................. | G06F 1/1632 361/679.28 |
| 8,059,395 B2 | 11/2011 | Zhang et al. | | |

(Continued)

FOREIGN PATENT DOCUMENTS

| | | |
|---|---|---|
| CN | 201796319 U | 4/2011 |
| CN | 102081951 A | 6/2011 |
| TW | 201310206 A1 | 3/2013 |

OTHER PUBLICATIONS

Chinese Office Action dated Feb. 3, 2016 in application No. 201210309856.8 and its English translation of pp. 3 to 5. pp. 1-12.

*Primary Examiner* — Daniel Wiley
(74) *Attorney, Agent, or Firm* — Muncy, Geissler, Olds & Lowe, P.C.

(57) ABSTRACT

An expansion platform is disclosed. The expansion platform includes a main body, a moving element, a first elastic element, and a positioning device. The moving element moveably combines with the main body and includes at least one fixed element and a sliding slot. The positioning device includes a second elastic element and a positioning element connected to the main body and passing through the sliding slot. The positioning element is pressed by the insertion of the portable electronic apparatus to be removed from a fixed state between the positioning element and the sliding slot, and the moving element is moved to fix the portable electronic apparatus. When the moving element moves reversely to an unlocked position, the portable electronic apparatus detaches from the main body, and the positioning element moves to an initial position and then is fixed by the sliding slot to stop the moving element.

11 Claims, 17 Drawing Sheets

(56) References Cited

U.S. PATENT DOCUMENTS

| | | | | |
|---|---|---|---|---|
| 8,085,532 B2* | 12/2011 | Tseng | ............... | E05B 17/0033 361/679.58 |
| 8,238,085 B2* | 8/2012 | Wu | ...................... | G06F 1/1616 312/223.1 |
| 8,817,456 B2* | 8/2014 | Lin | ...................... | G06F 1/1669 361/679.29 |
| 9,047,049 B2* | 6/2015 | Yang | ..................... | G06F 1/1626 |
| 9,077,095 B2* | 7/2015 | Lin | ......................... | H01R 13/42 |
| 2003/0231465 A1* | 12/2003 | Weng | .................... | G06F 1/1632 361/679.41 |
| 2005/0276010 A1* | 12/2005 | Song | .................... | G06F 1/1679 361/679.06 |
| 2010/0181450 A1* | 7/2010 | Hulick | ................ | G06F 1/1632 248/229.2 |

\* cited by examiner

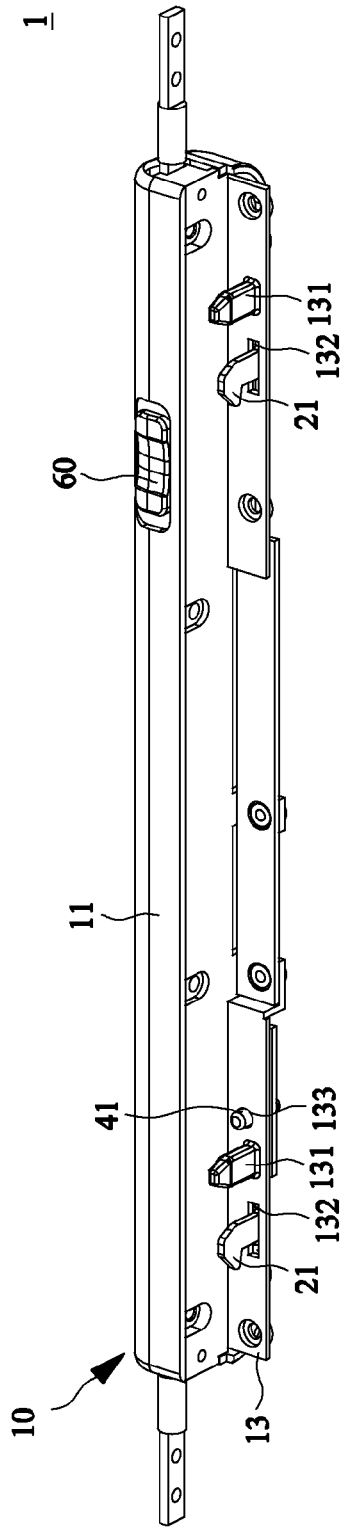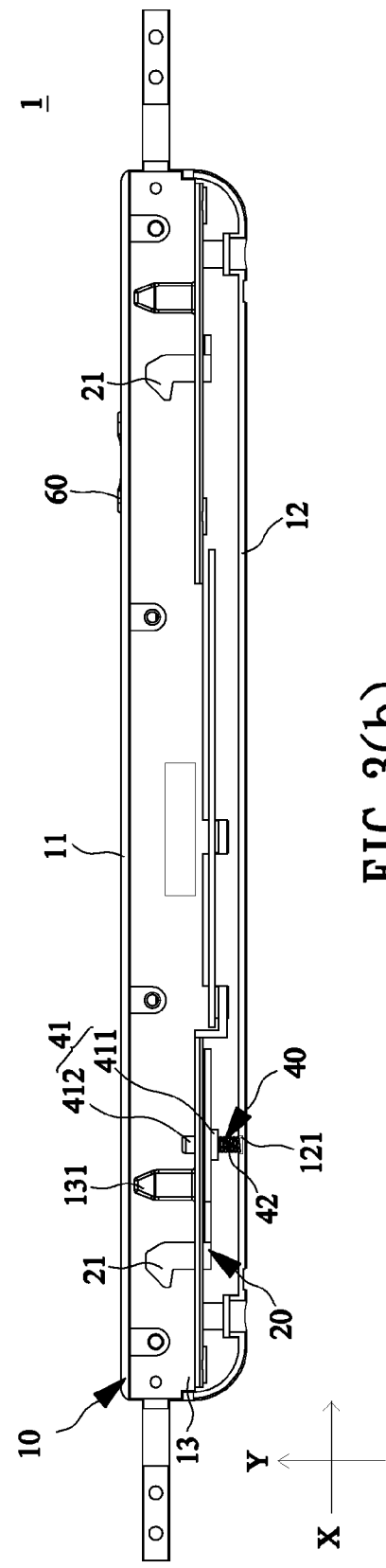
FIG. 3(a)
FIG. 3(b)

ID-ments between the first position and the second position. The positioning element protrudes from the main body when it is in the first position.

EXPANSION PLATFORM FOR PORTABLE ELECTRONIC APPARATUS

BACKGROUND OF THE DISCLOSURE

1. Field of the Disclosure

The present disclosure relates to an expansion platform, and more particularly, to an expansion platform that can be easily plugged into and unplugged from a portable electronic apparatus.

2. Description of the Related Art

In recent years, portable computers such as Tablet PCs have been greatly increasing in popularity. Compared to ordinary laptops, tablet computers are more portable and support touch input, allowing more intuitive operation. However, many users are familiar with keyboard input, so the tablet computer, which is not configured with a physical keyboard and thus lacks this input method, does not fit users' needs. Therefore, an expansion platform with a keyboard module for user input specifically designed for tablet computers is now available on the market. The user can combine the tablet PC with the expansion platform to make the two electrically connected to form a flip-like use pattern similar to that of a notebook computer. After the user rotates the tablet PC relative to the expansion platform to a viewable angle, the tablet PC can be operated like a notebook computer, and the keyboard module provided can be used as an input device.

Conventionally, when a user wishes to use the expansion platform, the tablet PC is plugged directly in the expansion platform to form an electrical connection. When the user separates the tablet PC from the expansion platform, direct force is applied to the tablet PC to allow the tablet PC to be pulled out from the platform. Since the conventional expansion platform does not provide a stable blocking effect for the tablet PC, the tablet PC may inadvertently be detached from the expansion platform. In addition, the user may damage the surface of the tablet PC and other parts such as the connection interface due to the use of improper force when plugging in the expansion platform, which may cause more inconvenience to the user.

Accordingly, it is necessary to provide an expansion platform structure that can be easily plugged into or unplugged from a portable electronic device.

SUMMARY OF THE DISCLOSURE

It is a major object of the present disclosure to provide an expansion platform that can be easily plugged into and unplugged from a portable electronic apparatus.

To achieve the aforementioned objective, an expansion platform for a portable electronic apparatus of the present disclosure comprises a main body, a moving element, a first elastic element, and a positioning device. The moving element movably combines with the main body and moves relative to the main body along a first axial direction between a locked position and an unlocked position. The moving element comprises at least one blocking element and a sliding slot. Each blocking element protrudes from the main body. The elastic element comprises two ends respectively connected to the main body and the moving element. The positioning device, which is combined with the main body, comprises a positioning element and a second elastic element. The positioning element is held against the main body by the second elastic element and passes through the sliding slot to be substantially perpendicular to the first axial direction and moves between the first position and the second position. The positioning element protrudes from the main body when it is in the first position.

When a portable electronic apparatus is plugged into the main body, the positioning element is pressed from a first position to a second position such that the positioning element is detached from the blocking of the sliding slot, thereby allowing the moving element to drive at least one blocking element through the first elastic element to a locked position to fix the portable electronic apparatus; after the moving element reversely moves to an unlocked position, the portable electronic apparatus can be detached from the main body, and the positioning element is returned to the first position by the second elastic element and is then fixed by the sliding slot to limit the movement of the moving element.

In an embodiment of the present disclosure, the sliding slot comprises a first slot portion and a second slot portion interconnected with each other, and the slot width of the first slot portion is larger than that of the second slot portion. The positioning structure comprises a first positioning portion and a second positioning portion stacked on the first positioning portion. The diameter of the first positioning portion is not greater than the slot width of the first slot portion but is greater than the slot width of the second slot portion. Also, the diameter of the second positioning portion is not greater than the slot width of the second slot portion.

In an embodiment of the present disclosure, the positioning device further comprises an arm, which comprises a first end and a second end. The first end is connected to the positioning element, and the second end forms a blocking structure. The moving element further comprises a partition having a through hole and a limiting portion. When the positioning element is in the first position, the blocking structure of the arm is located corresponding to the through hole; when the positioning element is in the second position, the blocking structure of the arm is located corresponding to the limiting portion.

Through this design, the expansion platform for a portable electronic apparatus of the present disclosure can achieve a fixing effect for the electronic apparatus by the portable electronic apparatus being plugged directly into the expansion platform and allow users to easily pull out the portable electronic apparatus with one or both hands in accordance with different embodiments. Therefore, the convenience of use can be improved.

BRIEF DESCRIPTION OF THE DRAWINGS

FIG. 3(a) is an assembly diagram illustrating the expansion platform for a portable electronic apparatus when the positioning element is in a first position in the first embodiment of the present disclosure;

FIG. 3(b) is a side view illustrating the expansion platform for a portable electronic apparatus when the positioning element is in a first position in the first embodiment of the present disclosure;

FIG. 4(a) is a view illustrating a main body and a moving element of the expansion platform for a portable electronic apparatus in the first embodiment of the present disclosure before a portable electronic apparatus is plugged in;

FIG. 4(b) is a side view illustrating the expansion platform for a portable electronic apparatus in the first embodiment of the present disclosure before the portable electronic apparatus is plugged in;

FIG. 5(a) is a view illustrating the main body and the moving element of the expansion platform for a portable electronic apparatus in the first embodiment of the present disclosure after the portable electronic apparatus is plugged in;

FIG. 5(b) is a side view illustrating the expansion platform for a portable electronic apparatus in the first embodiment of the present disclosure after the portable electronic apparatus is plugged in;

FIG. 8(a) is a view illustrating the main body and the moving element of the expansion platform for a portable electronic apparatus in the second embodiment of the present disclosure before the portable electronic apparatus is plugged in;

FIG. 8(b) is a side view illustrating the expansion platform for a portable electronic apparatus in the second embodiment of the present disclosure before the portable electronic apparatus is plugged in;

FIG. 9(a) is a view illustrating the main body and the moving element of the expansion platform for a portable electronic apparatus in the second embodiment of the present disclosure after the portable electronic apparatus is plugged in;

FIG. 9(b) is a side view illustrating the expansion platform for a portable electronic apparatus in the second embodiment of the present disclosure after the portable electronic apparatus is plugged in;

DETAILED DESCRIPTION OF THE PREFERRED EMBODIMENT

The technical content of the disclosure will become more apparent from the following detailed descriptions of several preferred embodiments.

Figure 1:
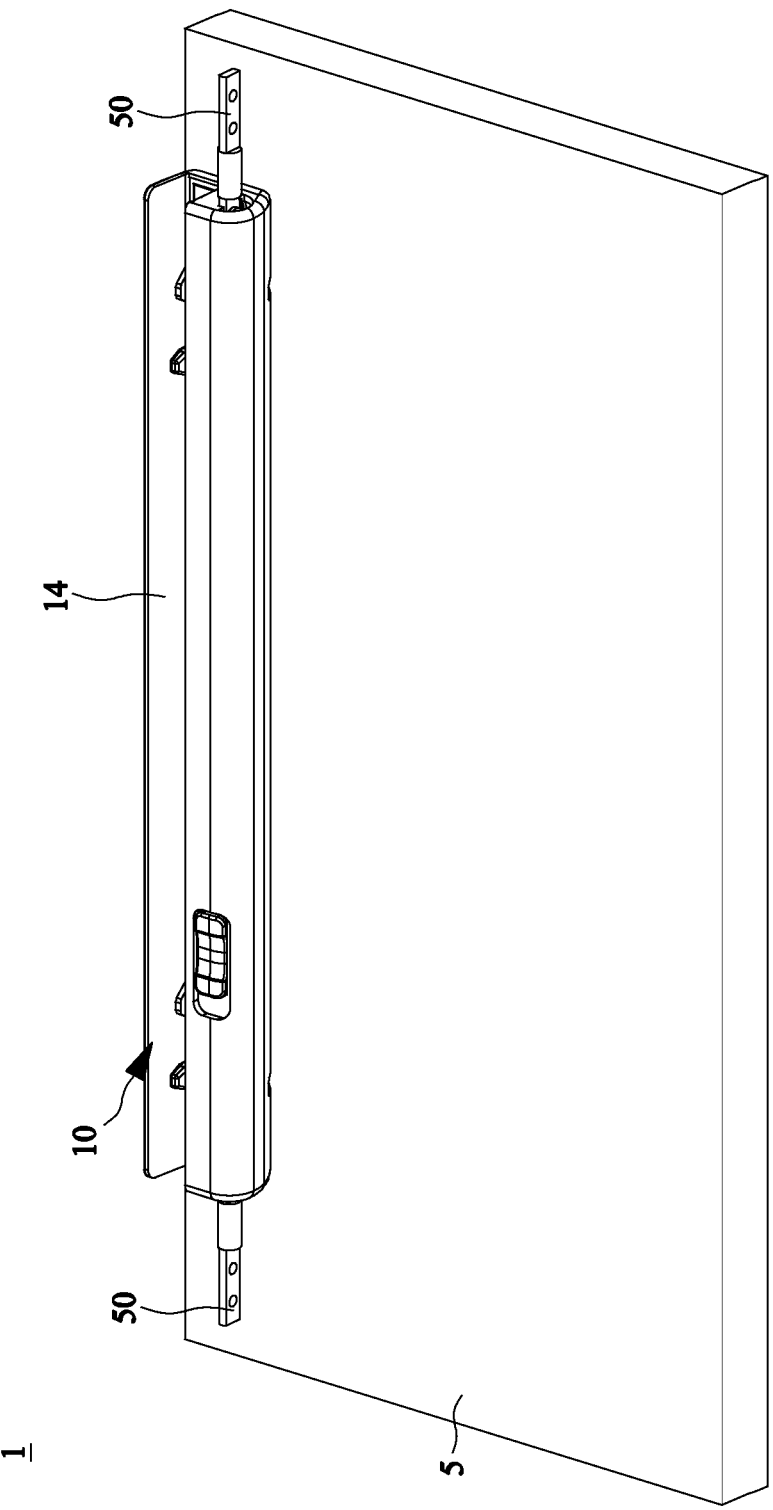
FIG. 1 is a view illustrating an expansion platform for a portable electronic apparatus of the present disclosure.

Please first refer to FIG. 1, which is a view showing an expansion platform for a portable electronic apparatus 1 of the present disclosure.

As shown in FIG. 1, the expansion platform 1 for the portable electronic apparatus of the present disclosure allows the portable electronic apparatus to be plugged into a groove 14 of the main body 10. Also, the main body 10 is connected to a base 5 of an input module provided with, for example, a keyboard by a pivoting element 50, such that the main body 10 can rotate relative to the base 5 for the user to operate the electronic apparatus, but the present disclosure is not limited to this. The expansion platform 1 for the portable electronic apparatus of the present disclosure can be electrically connected to the portable electronic apparatus by using a corresponding connection interface (not shown in the FIGs, in the form of a USB or other data transfer interface) for data transfer. Since the connection interface is known in the art, it will not be described in detail here. In order to clearly illustrate the structure and characteristics of the present disclosure, the base 5 is omitted in the following figures. In addition, in each of the following embodiments, tablet PCs are used as examples of the portable electronic apparatus. However, according to different types of applications, the portable electronic apparatus can also be a smart phone or other electronic device with a similar structure and is not limited to the present embodiment.

Figure 2:
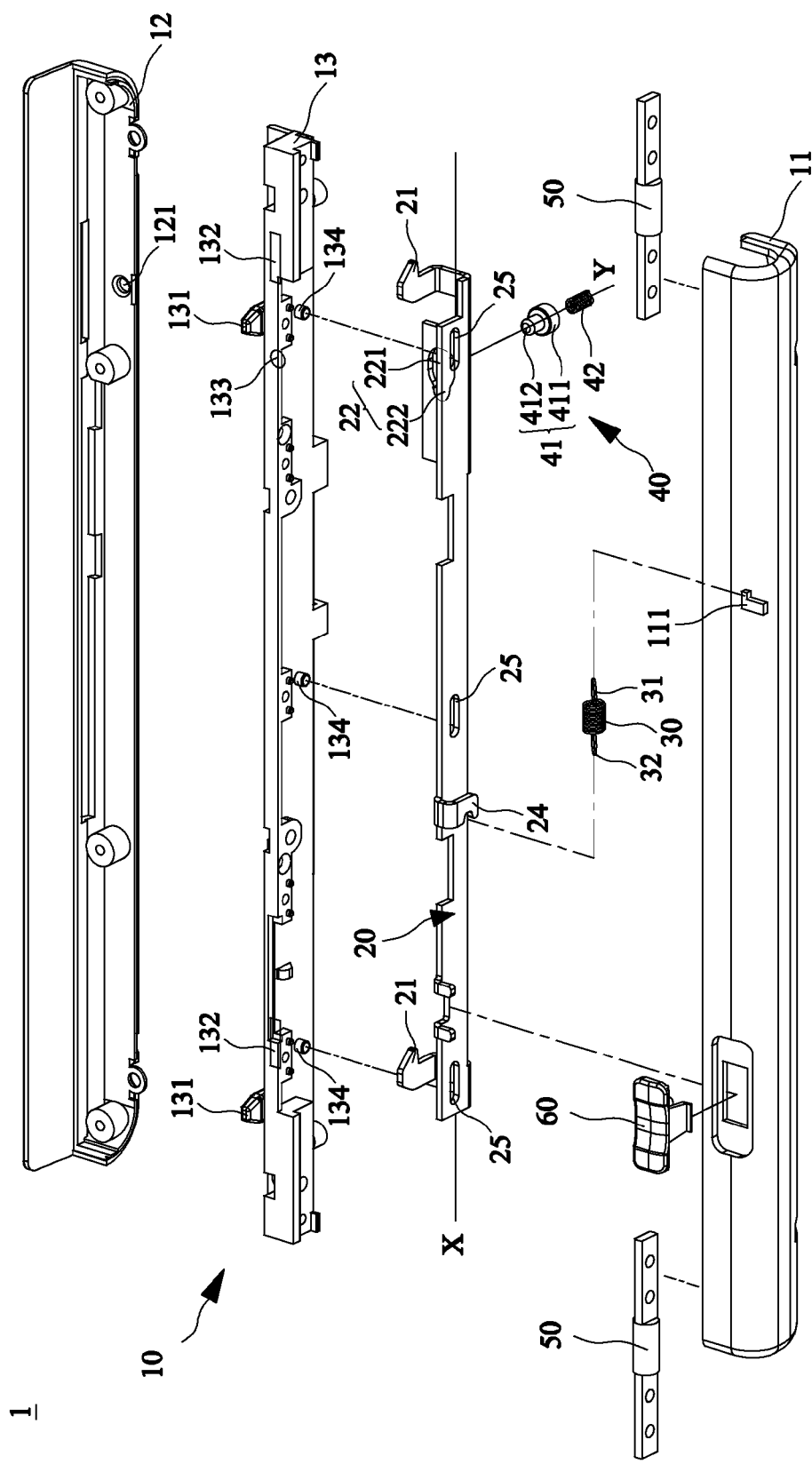
FIG. 2 is a structural exploded view of the expansion platform for a portable electronic apparatus in a first embodiment of the present disclosure.

Please refer to FIGS. 2, 3(a), and 3(b). FIG. 2 is a structural exploded view of the expansion platform 1 for a portable electronic apparatus in a first embodiment of the present disclosure; FIG. 3(a) is an assembly diagram showing the expansion platform for a portable electronic apparatus when the positioning element is in a first position in the first embodiment of the present disclosure; FIG. 3(b) is a side view showing the expansion platform for a portable electronic apparatus when the positioning element is in a first position in the first embodiment of the present disclosure. It is noted that the back cover 12 has been omitted in FIG. 3(a) in order to clearly illustrate the structural design of the support element 13 operating with the moving element 20.

As shown in FIGS. 2 and 3(a), the expansion platform 1 for the portable electronic apparatus of the present disclosure comprises a main body 10, a moving element 20, a first elastic element 30, and a positioning device 40. Both sides of main body 10 can be combined with the pivoting element 50 for pivotally connecting to a component such as the above-mentioned base in FIG. 1. In an embodiment of the present disclosure, the main body 10 comprises a front cover 11, a back cover 12, and a support element 13 interposed between the front cover 11 and the back cover 12 for allowing the main body 10 to form the aforementioned groove 14 for plugging in the portable electronic apparatus. The front cover 11 comprises a fixed portion 111 for fixing the first elastic element 30, and the back cover 12 comprises an accommodating portion 121.

The support element 13 comprises at least one positioning column 131, at least one slot 132, and an accommodating hole 133. Each positioning column 131 is used with the corresponding structure of the portable electronic apparatus to limit an insert position of the portable electronic apparatus in the groove 14. In this embodiment, two positioning columns 131 are used and respectively provided on the opposite sides of the support element 13, but the present disclosure is not limited to this. Each slot 132 is a straight slot for allowing the blocking element 21 of the moving element 20 to pass therethrough and slide therein. The accommodating hole 133 is disposed corresponding to the positioning device 40 for allowing the positioning element 41 to pass therethrough and then to be protruded from the main body 10.

The moving element 20 movably combines to the main body 10 and moves relative to the main body 10 along a first axial direction X between a locked position and an unlocked position. In this embodiment, the moving element 20 comprises a plurality of holes 25 for allowing the guide post 134 disposed corresponding to the support element 13 to correspondingly pass therethrough; thereby, the moving element 20 combines with the support element 13, and the moving element 20 moves relative to the support element 13 through the use of the guide post 134 with the hole 25, but the present disclosure is not limited to this. The moving element 20 comprises at least one blocking element 21. Each blocking element 21 passes through each slot 132 corresponding to the support element 13 to protrude from the main body 10 for fixing the plugged-in portable electronic apparatus. In addition, the moving element 20 further comprises a corresponding fixed portion 24 for fixing the first elastic element 30.

The moving element 20 further comprises a sliding slot 22 comprising a first slot portion 221 and a second slot portion 222. The slot width of the first slot portion 221 is larger than that of the second slot portion 222. Through the design of different widths of the sliding slot with the corresponding design of the positioning device 40, the positioning device 40 can cause a blocking effect to the moving element 20 under different conditions; wherein the shape of the first slot portion 221 and the second slot portion 222 may vary depending on the design. In this embodiment, each first slot portion 221 and each second slot portion 222 are sliding slots having an approximately oval shape and connected to each other to form a combination of sliding slots, but the present disclosure is not limited to this.

The first elastic element 30 comprises two ends 31, 32, which are respectively connected to the fixed portion 111 of the front cover 11 and the corresponding fixed portion 24 of the moving element 20, such that the elastic element 30 can provide the restoring force for the moving element 20 to move relative to the main body 10. In this embodiment, the first elastic element 30 is a tensile spring. When the moving element 20 is in an unlocked position, the first elastic element 30 is stretched out with the elastic restoring force toward the locked position; when the moving element 20 is in a locked position, the first elastic element 30 remains in a contracting state, but the present disclosure is not limited to this.

In addition, in the present embodiment, the expansion platform for a portable electronic apparatus 1 of the present disclosure further comprises a pushing element 60 connected to the moving element 20 and exposed from the main body 10. The pushing element 60 adopts the form of a push button. When the external force is applied to the pushing element 60 toward the first axial direction X, the pushing element 60 drives the moving element 20 to move from the locked position to the unlocked position for the user to operate in order to achieve the unlocking effect of the portable electronic apparatus. After the displacement of the moving element 20, the elastic restoring force of the first elastic element 30 causes the pushing element 60 to gradually move back to the original position with the moving element 20 before any external force is applied.

As shown in FIGS. 2, 3(a), and 3(b), the positioning device 40, which is combined with the main body 10, comprises a positioning element 41 and a second elastic element 42. The positioning element 41 is held against the back cover 12 of the main body 10 by the second elastic element 42, such that one end of the second elastic element 42 is disposed within the accommodating portion 121 of the back cover 12, and another end of the second elastic element 42 is connected to the positioning element 41. Also, the positioning element 41 is kept passing through the sliding slot 22 to allow the positioning element 41 to move within the sliding slot 22 when the moving element 22 moves along the first axial direction X. By using the second elastic element 42, the positioning element 41 can move relative to the support element 13 and the moving element 20 in the second axial direction Y, which is substantially perpendicular to the first axial direction X.

The positioning element 41 comprises a first positioning portion 411 and a second positioning portion 412 stacked on the first positioning portion 411. In such a design, a diameter of the first positioning portion 411 is not greater than a slot width of the first slot portion 221 but is greater than the slot width of the second slot portion 222, such that the first positioning portion 411 is allowed to move only within the first slot portion 221. Also, a diameter of the second positioning portion 412 is not greater than a slot width of the second slot portion 222, such that the second positioning portion 412 can move between the first slot portion 221 and the second slot portion 222. In this embodiment, the first positioning portion 411 and the second positioning portion 412 form a concentric cylindrical structure; however, structures such as an elliptical cylinder or a combination of other columnar structures with surface design can also be used, but the present disclosure is not limited to this embodiment.

As shown in FIGS. 3(a) and 3(b), in the present embodiment, the second elastic element 42 is a compressive spring. When the positioning element 41 is not pressed by external force, the positioning element 41 is in a first position. At this time, the positioning element 41 passes through the sliding slot 22 of the moving element 20 and the accommodating hole 133 of the support element 13; then the positioning element 41 protrudes from the main body 10. Meanwhile, the second elastic element 42 is also not pressed by external force and is located within the groove 14 of the main body 10 for the portable electronic apparatus to be plugged in correspondingly.

Figure 4A:
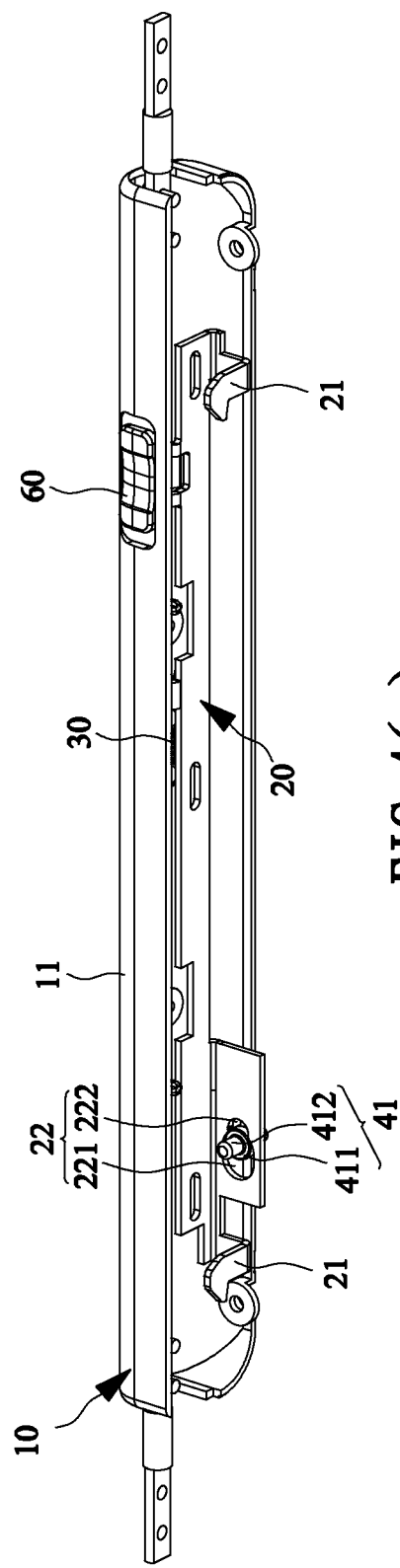
Figure 4B:
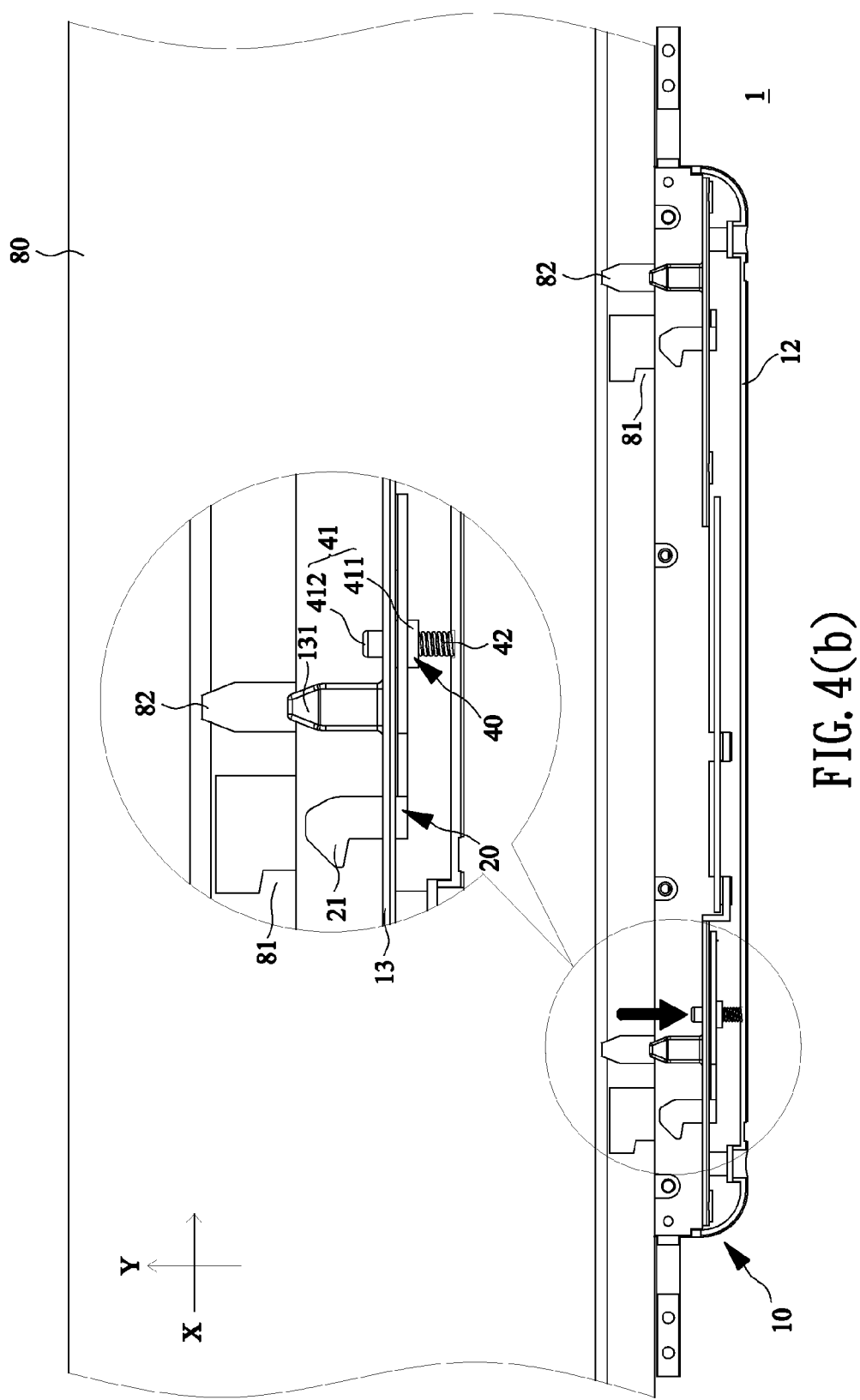

Please refer to both FIGS. 4(a) and 4(b), where FIG. 4(a) is a view showing a main body 10 and a moving element 20 of the expansion platform for a portable electronic apparatus in the first embodiment of the present disclosure before a portable electronic apparatus 80 is plugged in; FIG. 4(b) is a side view showing the expansion platform 1 for a portable electronic apparatus in the first embodiment of the present disclosure before the portable electronic apparatus 80 is plugged in. It should be noted that the back cover 12 and the support element 13 of the main body 10 have been omitted in FIG. 4(a) in order to clearly illustrate the structural design of the positioning element 41 operating in cooperation with the moving element 20.

As shown in FIGS. 4(a) and 4(b), before the portable electronic apparatus 80 is plugged into the groove 14 of the main body 10, the moving element 20 remains in an initial position, and the positioning element 41 remains in the first position. At this time, the first positioning portion 411 of the positioning element 41 passes through the sliding slot 22 of the moving element 20 to be against the first slot portion 221 to stop the moving element 20 from being driven by the elastic restoring force of the first elastic element 30 such that the portable electronic apparatus 80 can easily and correspondingly be plugged in. At this time, each blocking element 21 of the moving element 20 is located corresponding to the corresponding blocking portion 81 of the portable electronic apparatus 80, and the positioning column 131 of the main body 10 is located corresponding to the corresponding positioning portion 82 of the portable electronic apparatus 80; thereby, a user can plug the portable electronic apparatus 80 into the expansion platform 1 for the portable electronic apparatus of the present disclosure.

Figure 5A:
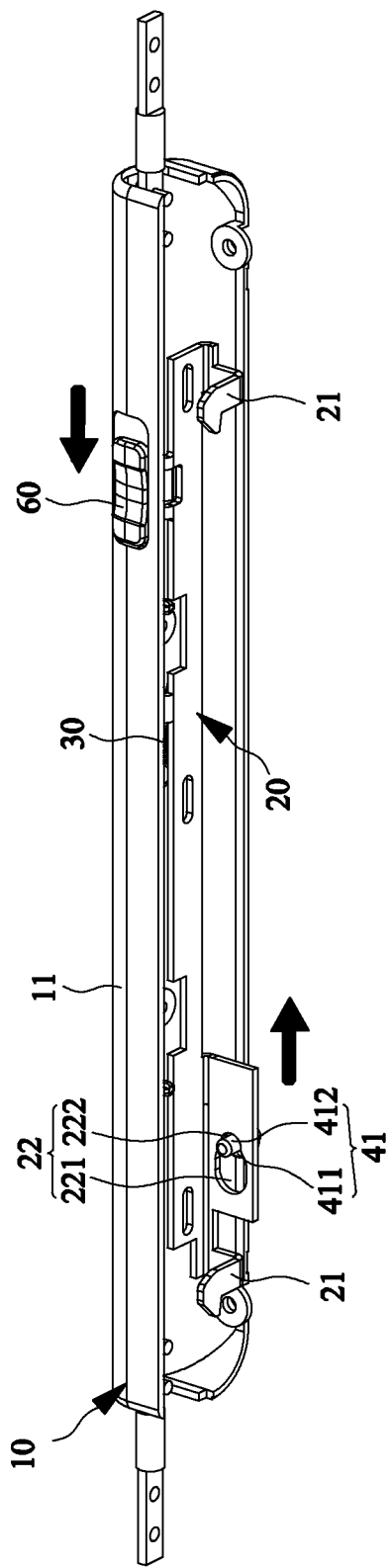
Figure 5B:
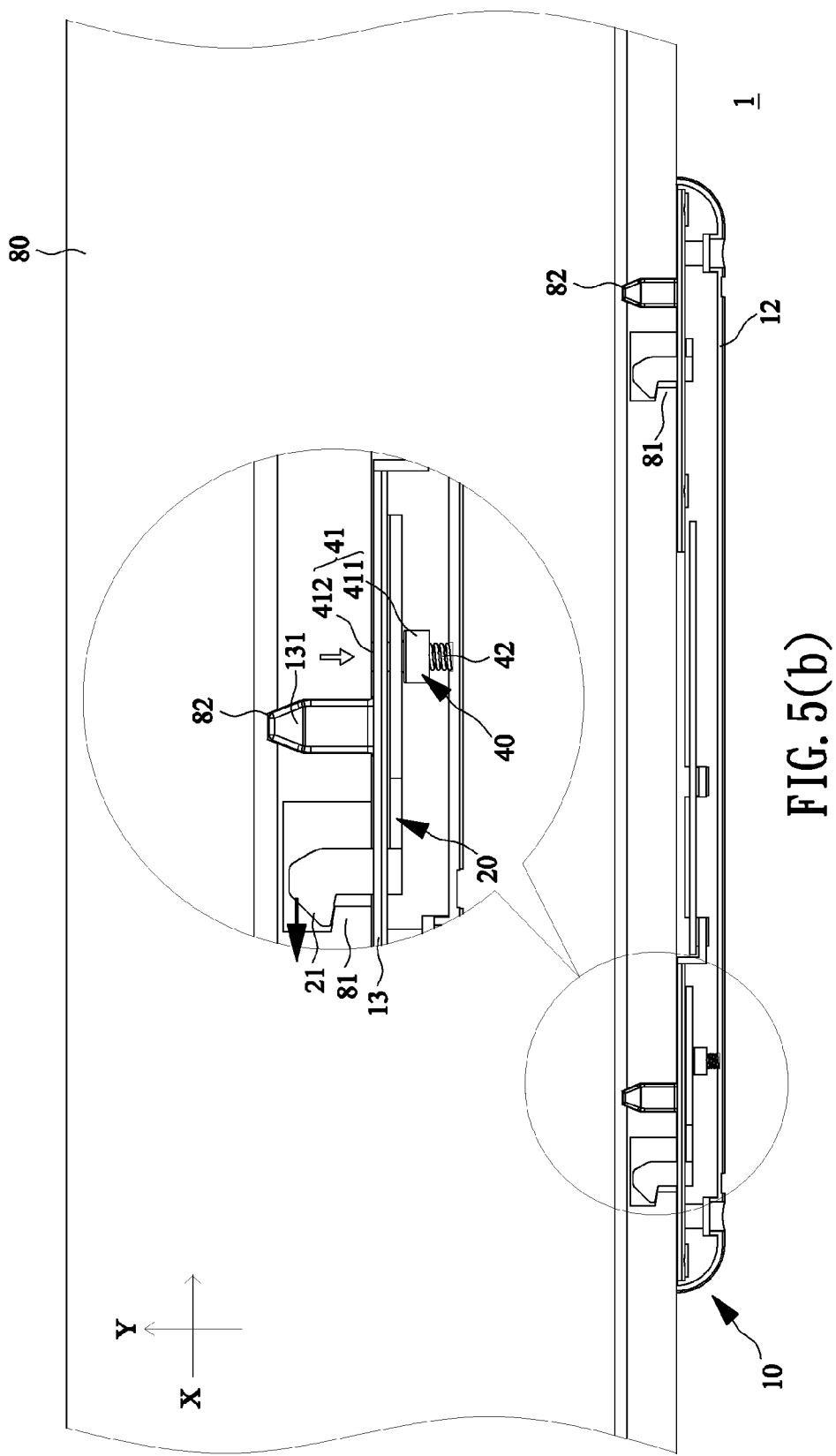

Please refer to both FIGS. 5(a) and 5(b), where FIG. 5(a) is a view showing the main body 10 and the moving element 20 of the expansion platform for a portable electronic apparatus in the first embodiment of the present disclosure after the portable electronic apparatus 80 is plugged in; FIG. 5(*b*) is a side view showing the expansion platform for a portable electronic apparatus in the first embodiment of the present disclosure after the portable electronic apparatus 80 is plugged in. It is noted that the back cover 12 and the support element 13 of the main body 10 have been omitted in FIG. 5(*a*) in order to clearly illustrate the structural design of the positioning element 41 operating in cooperation with the moving element 20.

As shown in FIGS. 5(*a*) and 5(*b*), when the portable electronic apparatus 80 is gradually plugged into the groove 14 of the main body 10, the positioning element 41 is pressed by the portable electronic apparatus 80 and then gradually moves from the aforementioned first position to a second position, such that the first positioning portion 411 of the positioning element 41 moves downwardly away from the first slot portion 221 of the sliding slot 22. Without the blocking by the first positioning portion 411 of the positioning element 41, the moving element 20 is driven by the elastic restoring force of the first elastic element 30 to move toward the locked position in the direction of the arrow shown in the figures. At this time, the second positioning portion 412 of the positioning element 41 moves to the second position and enters the second slot portion 222 of the sliding slot 22 until the second positioning portion 412 blocks the second slot portion 222, such that the moving element 20 is moved to the locked position. Each blocking element 21 of the moving element 20 forms the blocking with the corresponding blocking portion 81 of the portable electronic apparatus 80 to achieve the fixing effect for the portable electronic apparatus 80. The second elastic element 42 is kept in a contracting state when it is pressed by the positioning element and has the elastic restoring force to move toward the first position, while the positioning element 41 remains in the second position because the first positioning portion 411 and the second slot portion 222 are mutually blocked.

Figure 6A:
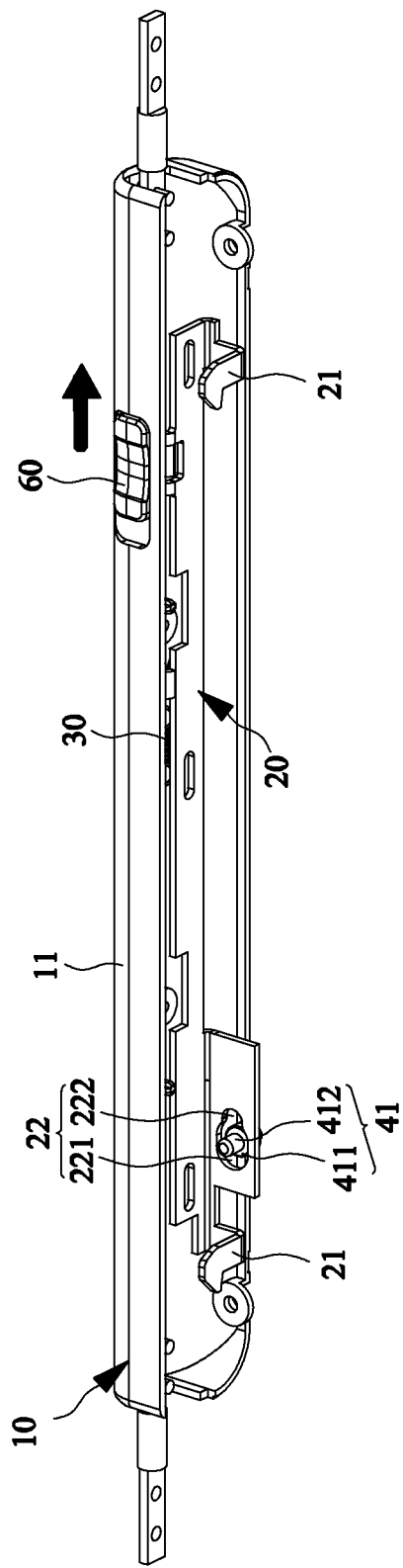
FIG. 6(a) is a view illustrating the main body and the moving element when the expansion platform for a portable electronic apparatus in the first embodiment of the present disclosure is unlocked.
Figure 6B:
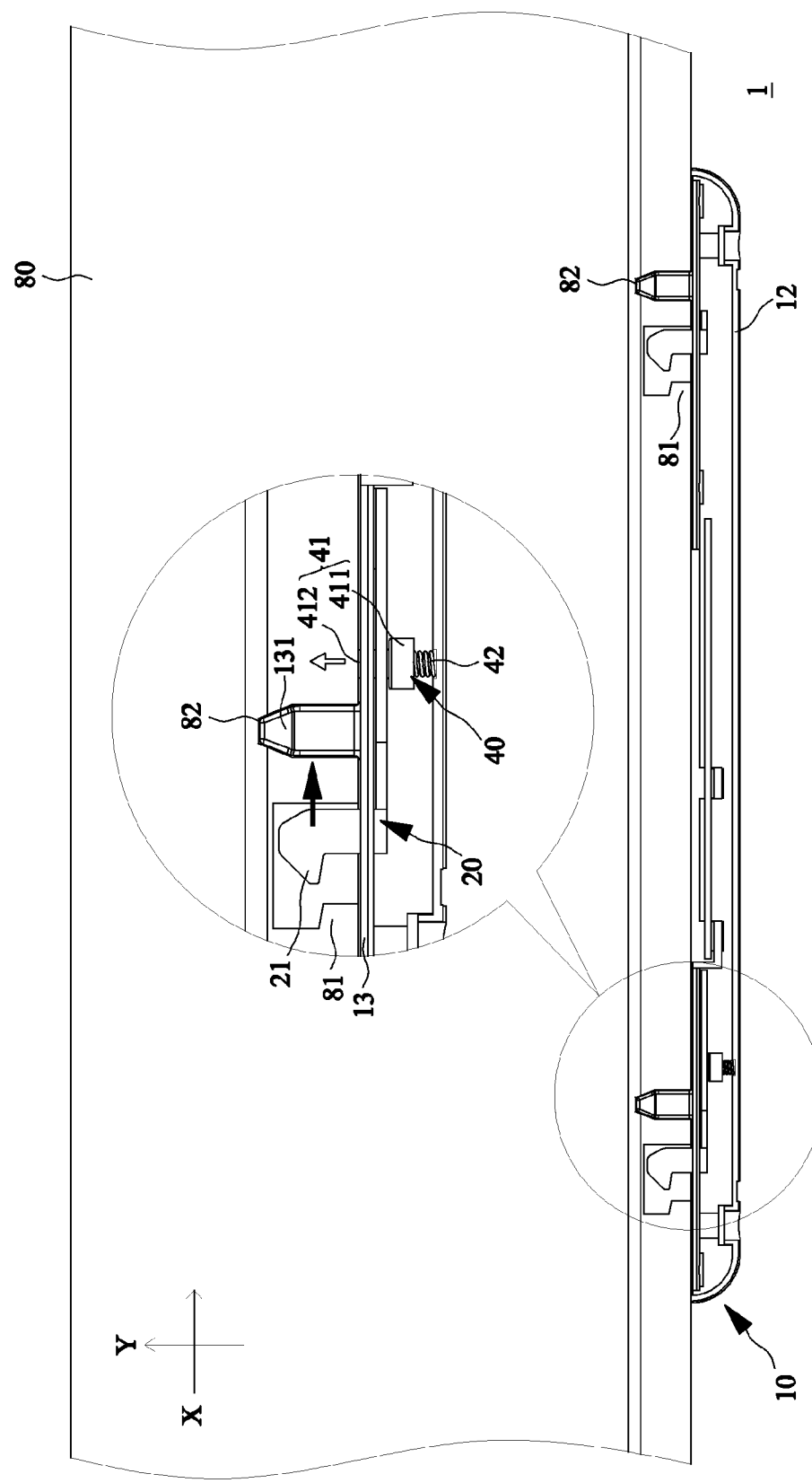
FIG. 6(b) is a side view illustrating the expansion platform for a portable electronic apparatus in the first embodiment of the present disclosure when the expansion platform is unlocked.

Please refer to both FIGS. 6(*a*) and 6(*b*), where FIG. 6(*a*) is a view showing the main body 10 and the moving element 20 after the expansion platform for a portable electronic apparatus in the first embodiment of the present disclosure is unlocked; FIG. 6(*b*) is a side view showing the expansion platform 1 for a portable electronic apparatus in the first embodiment of the present disclosure is unlocked. It should be noted that the back cover 12 and the support element 13 of the main body 10 have been omitted in FIG. 6(*a*) in order to clearly illustrate the structural design of the positioning element 41 operating in cooperation with the moving element 20.

As shown in FIGS. 6(*a*) and 6(*b*), when the portable electronic apparatus 80 has been plugged into the expansion platform 1 for a portable electronic apparatus of the present disclosure, and a user wants to pull out the portable electronic apparatus 80, the user first forces the pushing element 60 along the first axial direction X with a single hand, and thus the pushing element 60 drives the moving element 20 to move from the original locked position to a unlocked position in the direction of the arrow, and the first elastic element 30 is also gradually stretched, while each blocking element 21 of the moving element 20 is moved accordingly to detach from the blocking of the corresponding blocking element 81 of the portable electronic apparatus 80. With the movement of the moving element 20, the second positioning portion 412 of the positioning element 41 remains in the second position away from the second slot portion 222 and moves into the first slot portion 221. Also, the first positioning portion 411 of the positioning element 41 is not blocked by the second slot portion 222 and is pressed only by the portable electronic apparatus 80. In this case, the user may use one hand on the pushing element 60 to prevent the moving element 20 from moving toward the locked position due to the impact of the elastic restoring force of the first elastic element 30 while using the other hand to pull out the unlocked portable electronic apparatus 80 from the expansion platform 1 for a portable electronic apparatus of the present disclosure to complete the separation of the two.

After the user pulls out the portable electronic apparatus 80, and before the user's other hand has moved away from the pushing element 60, the positioning element 41 is no longer pressed by external force; at this time, the positioning element 41 moves from the second position to the first position by the elastic restoring force of the second elastic element 42, and thus the first positioning portion 411 of the positioning element 41 passes through the first slot portion 221 of the sliding slot 22. After the user releases the pushing element 60, the moving element 20 moves from the unlocked position to the locked position by means of the elastic restoring force of the first elastic element 30. However, the first positioning portion 411 of the positioning element 41 has fixed the first slot portion 221 of the sliding slot 22 during the movement, such that the moving element 20 can only return to the initial position as shown in FIG. 4(*a*) and remain fixed, which is the original state of the portable electronic apparatus 80 not being plugged in.

Through this design, the expansion platform 1 for a portable electronic apparatus of the present disclosure can allow the user to plug in the portable electronic apparatus 80 with a single hand with a fixing effect. After the pushing element 60 is unlocked with the other hand, the portable electronic apparatus 80 can be pulled out from the expansion platform 1 for a portable electronic apparatus of the present disclosure; thereby, the user can easily plug in and unplug the portable electronic apparatus 80.

Figure 7A:
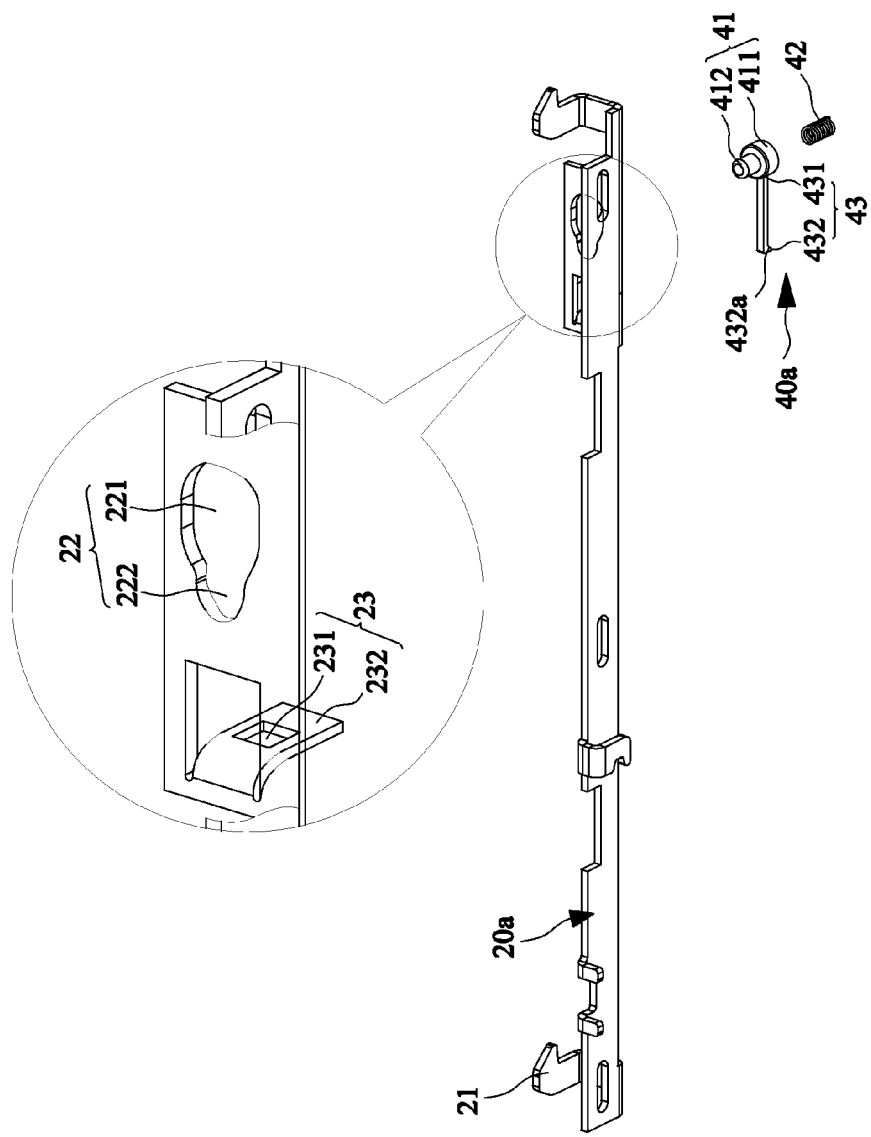
FIG. 7(a) is a schematic diagram illustrating the moving element and the positioning device of the expansion platform for a portable electronic apparatus in a second embodiment of the present disclosure.
Figure 7B:
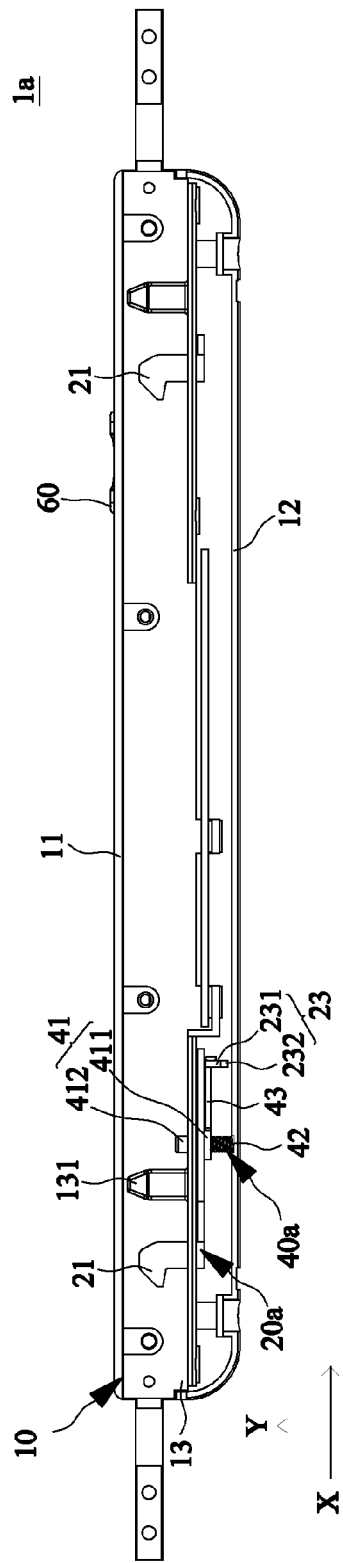
FIG. 7(b) is a side view illustrating the expansion platform for a portable electronic apparatus in the second embodiment of the present disclosure when the positioning element is in the first position.

Please refer to both FIGS. 7(*a*) and 7(*b*), where FIG. 7(*a*) is a schematic diagram showing the moving element 20*a* and the positioning device 40*a* of the expansion platform 1*a* for a portable electronic apparatus in a second embodiment of the present disclosure; FIG. 7(*b*) is a side view showing the expansion platform 1*a* for a portable electronic apparatus in the second embodiment of the present disclosure when the positioning element 40*a* is in the first position.

The present embodiment is a variation of the aforementioned first embodiment, wherein the moving element 20*a* and the positioning device 40*a* has been changed, and the remaining components are used in the same form as the structure in the aforementioned embodiment. As shown in FIGS. 7(*a*) and 7(*b*), the positioning device 40*a* of the expansion platform 1*a* for a portable electronic apparatus of the present disclosure, except the aforementioned positioning element 41 and the second elastic element 42, further comprises an arm 43. The arm 43 comprises a first end 431 and a second end 432. The first end 431 is connected to a first positioning portion 411 of the positioning element 41, such that the arm 43 extends toward a lateral side, and the second end 432 forms a blocking structure, which comprises an inclined plane 432*a*.

Also, the moving element 20*a* further comprises a partition 23, which is located corresponding to the arm 43 of the positioning device 40*a*. The partition 23 comprises a through hole 231 and a limiting portion 232. The through hole 231 is disposed above the limiting portion 232, and the size of the through hole 231 allows the second end 432 of the arm 43 to pass through. Accordingly, when the positioning element 41 is in the first position, the arm 43 is located corresponding to the through hole 231 allowing the arm 43 to pass through the partition 23 via the through hole 231; when the positioning element 41 is in the second position, the arm 43 is located corresponding to the limiting portion 232, such that the blocking or stop effect can be produced by the second end 432 of the arm 43 and the limiting portion 232.

Figure 8A:
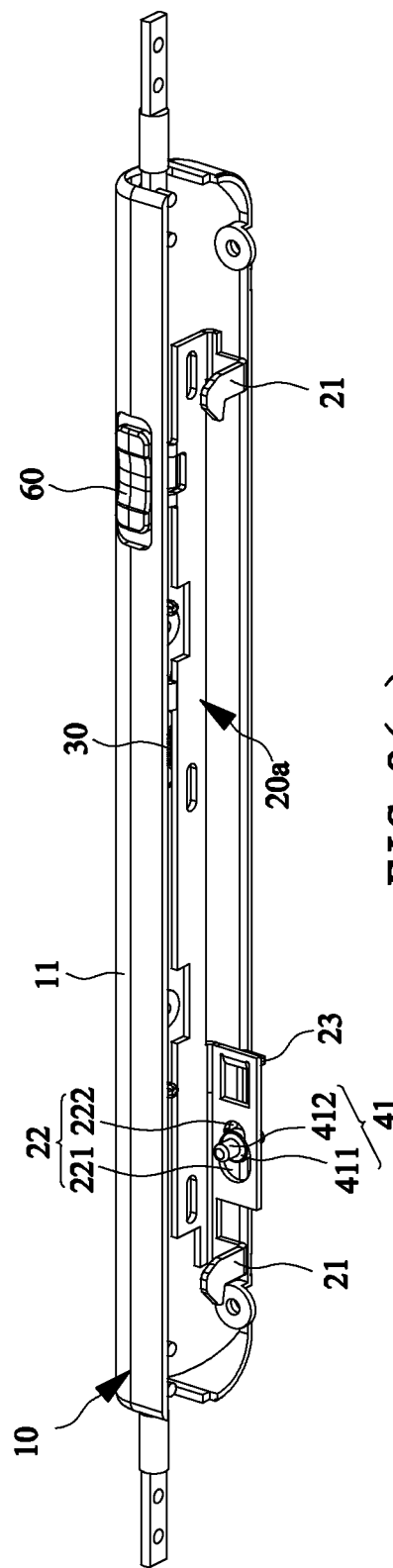
Figure 8B:
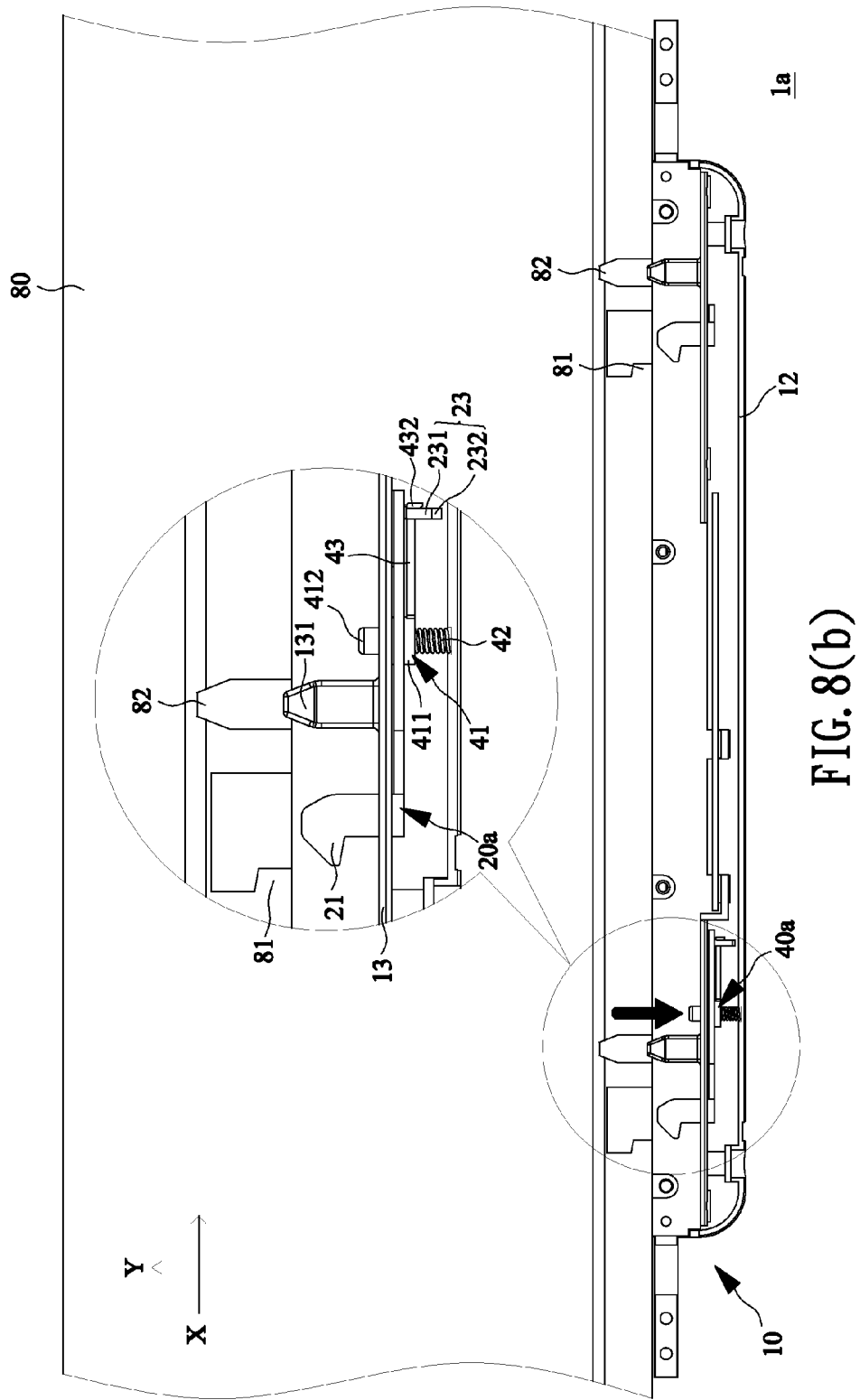

Please refer to both FIGS. 8(a) and 8(b), wherein FIG. 8(a) is a view showing the main body 10 and the moving element 20a of the expansion platform 1a for a portable electronic apparatus in the second embodiment of the present disclosure before the portable electronic apparatus 80 is plugged in; FIG. 8(b) is a side view showing the expansion platform 1a for a portable electronic apparatus in the second embodiment of the present disclosure before the portable electronic apparatus 80 is plugged in. It is noted that the back cover 12 and the support element 13 of the main body 10 have been omitted in FIG. 8(a) in order to clearly illustrate the structural design of the positioning element 41 operating with the moving element 20a.

As shown in FIGS. 8(a) and 8(b), before the portable electronic apparatus 80 is plugged into the groove 14 of the main body 10, the moving element 20a remains in the initial position, and the positioning element 41 of the positioning device 40a remains in the first position. At this time, the first positioning portion 411 of the positioning element 41 passes through the sliding slot 22 of the moving element 20a and is then against the first slot portion 221 for blocking the moving element 20a without being driven by the elastic restoring force of the first elastic element 30 such that the portable electronic apparatus 80 can easily be correspondingly plugged into the expansion platform 1a. In addition, when the moving element 20a is in the initial position, the blocking structure formed by the second end 432 of the arm 43 of the positioning device 40a passes through the through hole 231 of the partition 23 of the moving element 20.

Figure 9A:
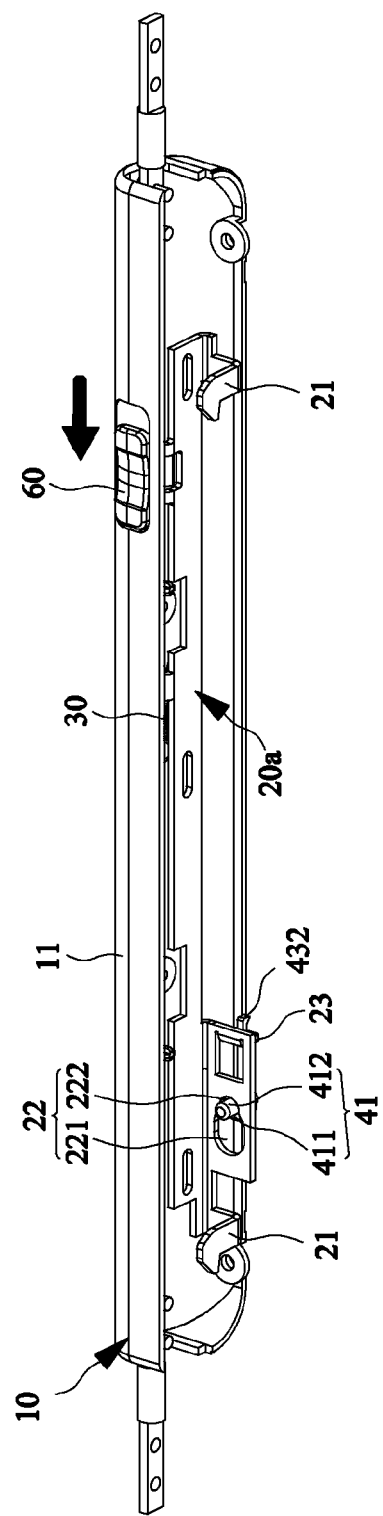
Figure 9B:
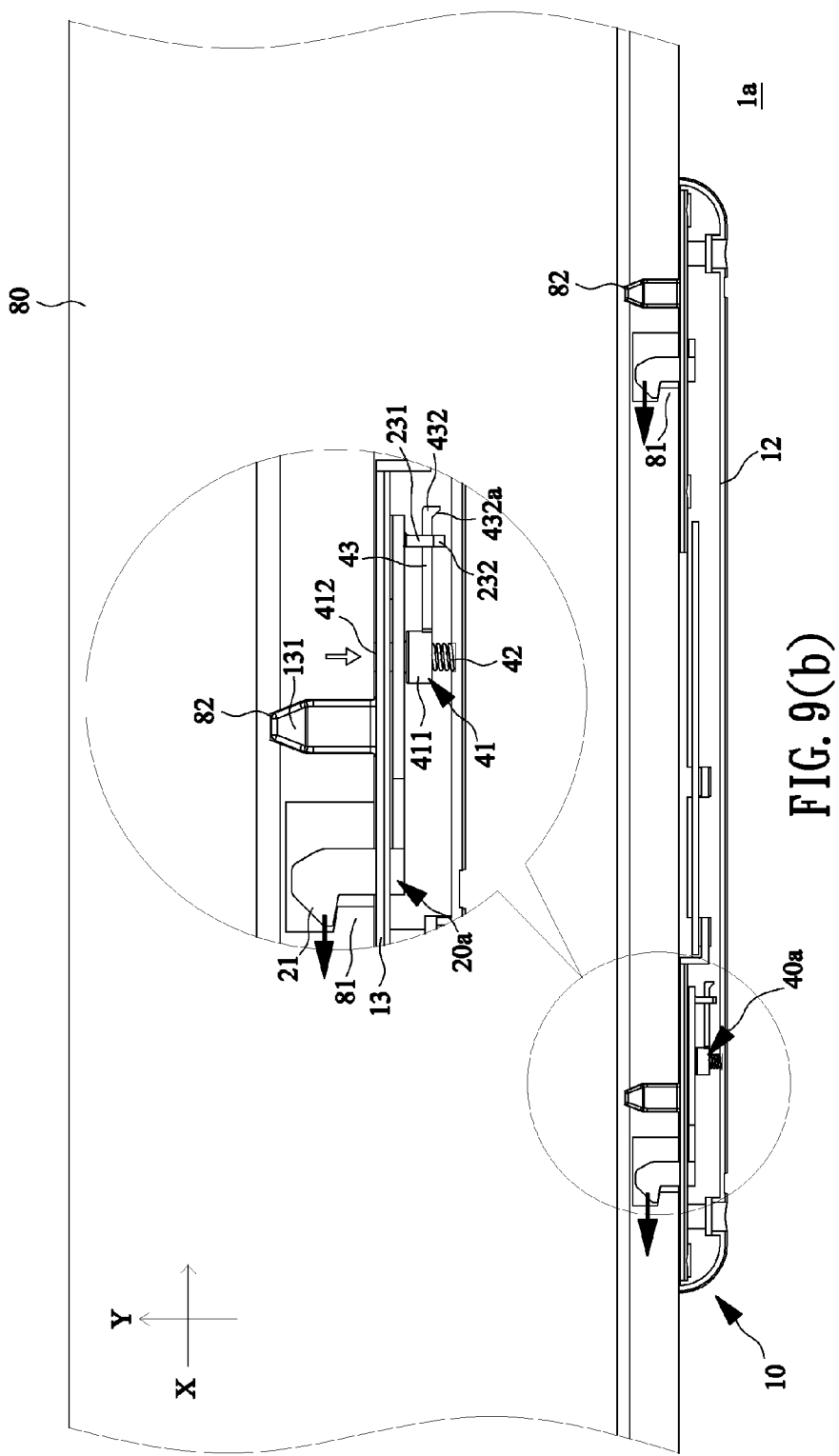

Please refer to both FIGS. 9(a) and 9(b), where FIG. 9(a) is a view showing the main body 10 and the moving element 20a of the expansion platform 1a for the portable electronic apparatus in the second embodiment of the present disclosure after the portable electronic apparatus 80 is plugged in; FIG. 9(b) is a side view showing the expansion platform 1a for a portable electronic apparatus in the second embodiment of the present disclosure after the portable electronic apparatus 80 is plugged in. It is noted that the back cover 12 and the support element 13 of the main body 10 have been omitted in FIG. 9(a) in order to clearly illustrate the structural design of the positioning element 41 operating in cooperation with the moving element 20a.

As shown in FIGS. 9(a) and 9(b), when the portable electronic apparatus 80 is gradually plugged into the groove 14 of the main body 10, the positioning element 41 is pressed by the portable electronic apparatus 80 and gradually moves from the aforementioned first position to the second position, the first positioning portion 411 of the positioning element 41 is downwardly detached from the first slot portion 221 of the sliding slot 22, and the arm 43 also moves downwardly with the positioning element 41. Without the blocking by the first positioning portion 411 of the positioning element 41, the moving element 20a is driven by the elastic restoring force of the first elastic element 30 to move toward the locked position in the direction of the arrow shown in the figures. At this time, the second positioning portion 412 of the positioning element 41 moves to the second position and enters the second slot portion 222 of the sliding slot 22 until the second positioning portion 412 blocks the second slot portion 222, then the moving element 20a is moved to the locked position consequently. When the moving element 20a moves toward the locked position, the second end 432 of the arm 43 moves away from the partition 23. Each blocking element 21 of the moving element 20a blocks the corresponding blocking portion 81 of the portable electronic apparatus 80 to achieve a fixing effect for the portable electronic apparatus 80. The second elastic element 42 remains in a contracting state because it is pressed by the positioning element but has the elastic restoring force to move toward the first position, while the positioning element 41 remains in the second position because the first positioning portion 411 and the second slot portion 222 are mutually blocked.

Figure 10A:
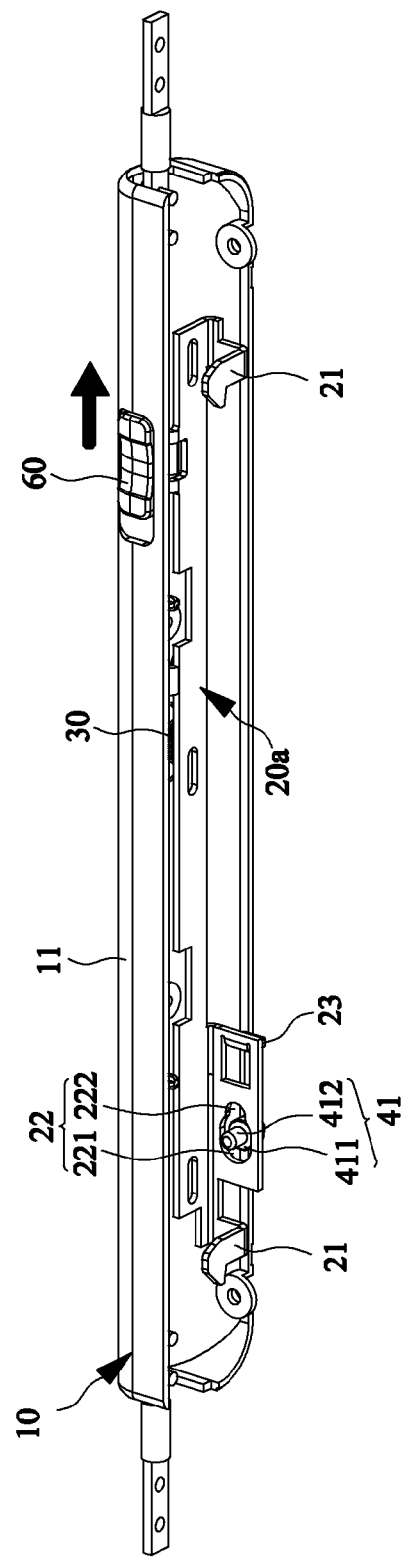
FIG. 10(a) is a view illustrating the main body and the moving element when the expansion platform for a portable electronic apparatus in the second embodiment of the present disclosure is unlocked.
Figure 10B:
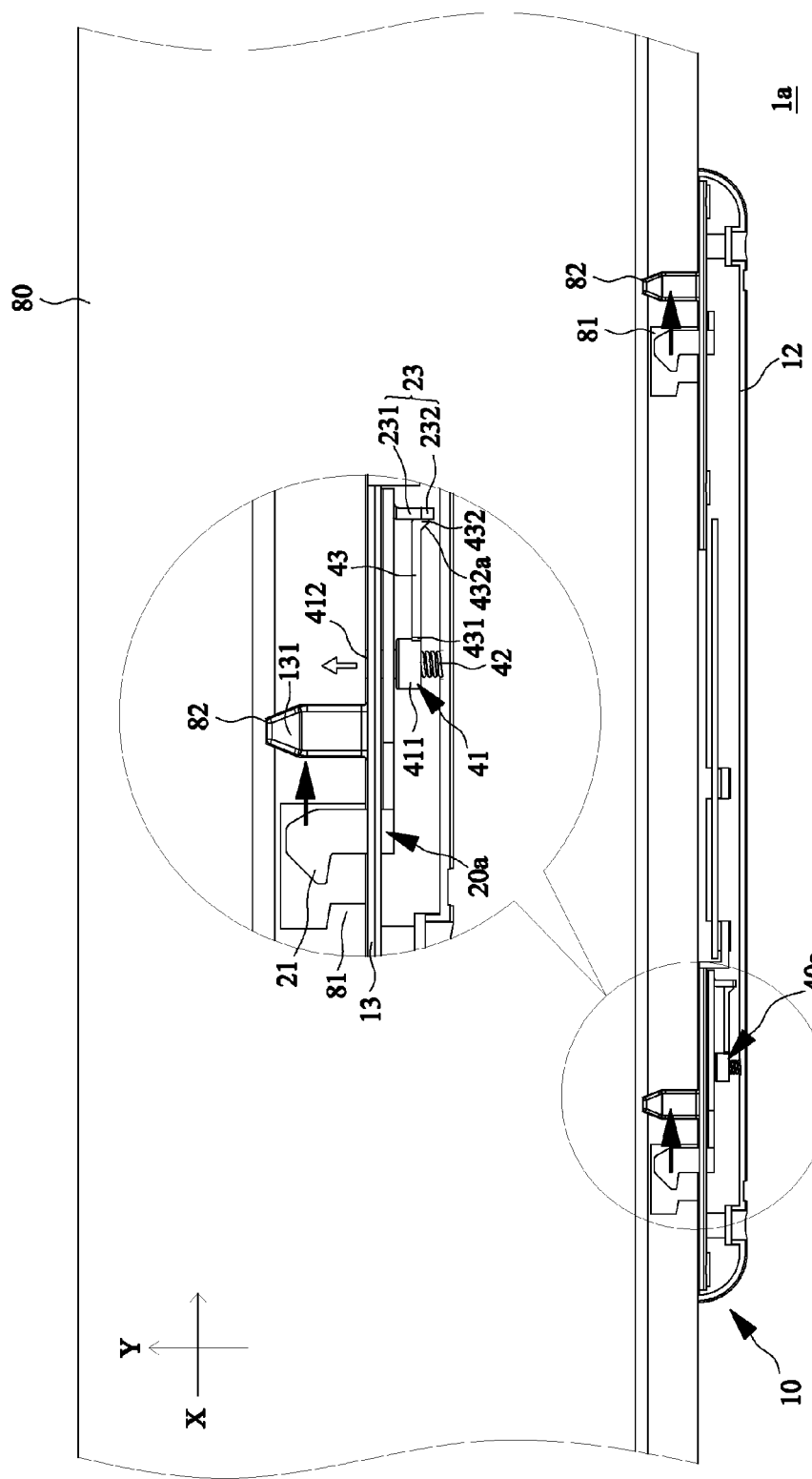
FIG. 10(b) is a side view illustrating the expansion platform for the portable electronic apparatus in the second embodiment of present disclosure when the expansion platform has been unlocked.

Please refer to both FIGS. 10(a) and 10(b), where FIG. 10(a) is a view showing the main body 10 and the moving element 20a when the expansion platform 1a for a portable electronic apparatus in the second embodiment of the present disclosure is unlocked; FIG. 10(b) is a side view showing the expansion platform 1a for the portable electronic apparatus in the second embodiment of the present disclosure when the expansion platform 1a has been unlocked. It is noted that the back cover 12 and the support element 13 of the main body 10 have been omitted in FIG. 10(a) in order to clearly illustrate the structural design of the positioning element 41 operating with the moving element 20a.

As shown in FIGS. 10(a) and 10(b), when the portable electronic apparatus 80 has been plugged into the expansion platform 1 for a portable electronic apparatus of the present disclosure, when a user wants to pull out the portable electronic apparatus 80 by forcing the pushing element 60 along the first axial direction X with a single hand, the pushing element 60 drives the moving element 20a to move from the original locked position to the unlocked position in the direction of the arrow as shown, and the first elastic element 30 is also gradually stretched out, while each blocking element 21 of the moving element 20 is also moved to detach from the blocking of the corresponding blocking portion 81 of the portable electronic apparatus 80. When the moving element 20a is moved, the second positioning portion 412 of the positioning element 41 that remains in the second position moves away from the second slot portion 222 and moves into the first slot portion 221. The first positioning portion 411 of the positioning element 41 is not blocked by the second slot portion 222 and is pressed only by the portable electronic apparatus 80.

Meanwhile, by moving of the moving element 20a, when the second end 432 of the arm 43 reaches the partition 23, due to the contact of the inclined plane 432a and the limiting portion 232 of the partition 23, the arm 43 is elastically deformed by the first end 431, which is connected to the positioning element 41 as a pivot, and then crosses the through hole 231. When the second end 432 passes through the partition 23 and returns to its initial position, the limiting portion 232 of the partition 23 provides a stop effect to the second end 432 of the arm 43 to restrict the moving element 20a from being pulled by the elastic restoring force of the first elastic element 30. Therefore, when a user forces the pushing element 60 to move the moving element 20a to the unlocked position, the user releases the force of the pushing element 60, and the moving element 20a is fixed by pushing the arm 43 against the limiting portion 232 of the partition 23. In this state, the user can unlock the portable electronic apparatus 80 with the same hand and pull it out from the expansion platform 1 for a portable electronic apparatus of the present disclosure to complete the separation of the two.

After the portable electronic apparatus 80 is pulled out, since the positioning element 41 is not pressed by external force, the positioning element 41 is moved by the elastic restoring force of the second elastic element 42 from the second position to the first position, such that the first positioning portion 411 of the positioning element 41 passes through the first slot portion 221 of the sliding slot 22. When the positioning element 41 is moved from the second position to the first position, the second end 432 of the arm 43 gradually moves upwardly to the through hole 231 corresponding to the partition 23 from the state of the partition 23 being against the limiting portion 232.

When the positioning element 41 reaches the first position, the second end 432 of the arm 43 is not blocked by the limiting portion 232, and the moving element 20a is moved by the elastic restoring force of the first elastic element 30 from the unlocked position toward the locked position accordingly, while the arm 43 passes through the through hole 231 of the partition 23. When the moving element 20a moves toward the locked position, the first positioning portion 411 of the positioning element 41 blocks the first slot portion 221 of the sliding slot 22, such that the moving element 20 can only return to the initial position as shown in FIG. 8(a) and remain fixed and thus return to the original state in which the portable electronic apparatus 80 is not plugged in. At this time, the second end 432 of the arm 43 has passed through the through hole 231 of the partition.

Through this design, the plugging in and unplugging of the portable electronic apparatus can easily be accomplished with one-handed operation. Accordingly, the expansion platform 1a for the portable electronic apparatus enables ease of plugging in and unplugging the portable electronic apparatus 80, which effectively improves the inconvenience of plugging in and unplugging the portable electronic apparatus, and provides a stable fixing effect when the portable electronic apparatus is plugged into the expansion platform. Therefore, the ease of use and safety can be enhanced.

As described above, the objectives, means, and effectiveness of the present disclosure are different from the characteristics in the prior art. It should be noted that the embodiments described above are for illustrating the principles and effects of the present disclosure and are not intended to limit the scope of the present disclosure. Any person skilled in the art should be able to make modifications and changes to the embodiments without departing from the technical principle and spirit of the present disclosure. The claims of the present disclosure within the scope of protection are described below.

What is claimed is:

1. An expansion platform for a portable electronic apparatus, allowing a portable electronic apparatus to be plugged in, comprising:
a main body;
a moving element movably combining to the main body for allowing the moving element to move relative to the main body along a first axial direction between a locked position and a unlocked position, the moving element comprising at least one blocking element and a sliding slot, each of the blocking elements protruding from the main body, wherein the sliding slot comprises a first slot portion and a second slot portion interconnected with each other, and a slot width of the first slot portion and a slot width of the second slot portion are different;
a first elastic element, comprising two ends which are respectively connected to the main body and the moving element; and
a positioning device, combined with the main body, comprising a positioning element and a second elastic element; the positioning element being pushed against the main body by the second elastic element and passing through the sliding slot to be substantially perpendicular to the first axial direction and move between a first position and a second position; in addition, the positioning element comprises a first positioning portion and a second positioning portion connected to the first positioning portion, a diameter of the first positioning portion and a diameter of the second positioning portion are different, and the positioning element protrudes from the main body and the first positioning portion is blocked by the sliding slot when in the first position;
when the portable electronic apparatus is plugged into the main body, the positioning element is pressed from the first position to the second position, such that the first positioning portion of the positioning element is detached from the blocking of the sliding slot, the second positioning portion enters the second slot portion and the moving element driving the at least one blocking element to the locked position by the first elastic element to fix the portable electronic apparatus;
after the moving element reversely moves the moving element to the unlocked position, the portable electronic apparatus is allowed to be pulled away from the main body, while the positioning element is returned to the first position by the second elastic element and fixed by the sliding slot to limit a movement of the moving element.

2. The expansion platform for a portable electronic apparatus as claimed in claim 1, wherein the diameter of the first positioning portion not being larger than the slot width of the first slot portion but being larger than the slot width of the second slot portion; the diameter of the second positioning portion not being larger than the slot width of the second slot portion.

3. The expansion platform for a portable electronic apparatus as claimed in claim 2, wherein the first positioning portion and the second positioning portion form a concentric cylindrical structure.

4. The expansion platform for a portable electronic apparatus as claimed in claim 2, wherein when the positioning element is in the first position, the positioning element moves within the sliding slot by the first positioning portion; when the positioning element is in a second position, the positioning element moves within the sliding slot by the second positioning portion.

5. The expansion platform for a portable electronic apparatus as claimed in claim 2, wherein the positioning device further comprises an arm having a first end and a second end, the first end being connected to the positioning element, and the second end forming a blocking structure.

6. The expansion platform for a portable electronic apparatus as claimed in claim 5, wherein the moving element further comprises a partition comprising a through hole and a limiting portion; when the positioning element is in the first position, the blocking structure of the arm is located corresponding to the through hole; when the positioning element is in the second position, the blocking structure of the arm is located corresponding to the limiting portion.

7. The expansion platform for a portable electronic apparatus as claimed in claim 6, wherein when the positioning element is in the first position, the arm is moved toward the locked position along with the moving element to pass through the through hole.

8. The expansion platform for a portable electronic apparatus as claimed in claim 6, wherein when the moving element moves from the locked position to the unlocked position, the arm of the positioning device located in the second position passes through the through hole with the moving element; when the moving element is moved to the unlocked position, the arm is pushed against the limiting portion by the blocking structure to limit the movement of the moving element.

9. The expansion platform for a portable electronic apparatus as claimed in claim 5, wherein the blocking structure comprises an inclined plane.

10. The expansion platform for a portable electronic apparatus as claimed in claim 1, further comprising a pushing element connected to the moving element and exposed on the main body, the pushing element being driven by an external force to move the moving element from the locked position to the unlocked position.

11. The expansion platform for a portable electronic apparatus as claimed in claim 1, wherein the main body further comprises at least one positioning column for limiting an insert position of the portable electronic apparatus.

* * * * *